United States Patent [19]

Lovelace

[11] 4,142,953
[45] Mar. 6, 1979

[54] SEMICONDUCTOR ETCHING

[75] Inventor: David F. Lovelace, Waltham Abbey, England

[73] Assignee: ITT Industries, Inc., New York, N.Y.

[21] Appl. No.: 891,885

[22] Filed: Mar. 30, 1978

[30] Foreign Application Priority Data

Apr. 1, 1977 [GB] United Kingdom ...... 13598/77

[51] Int. Cl.$^2$ ............................ C25F 3/12; C25F 3/14
[52] U.S. Cl. ............................... 204/129.3; 204/129.4; 204/129.95
[58] Field of Search ........... 204/129.1, 129.85, 129.95, 204/129.6, 129.3, 129.4

[56] References Cited

U.S. PATENT DOCUMENTS

| 3,184,399 | 5/1965 | Schnable et al. | 204/129.4 |
|---|---|---|---|
| 3,251,757 | 5/1966 | Schmitz | 204/129.3 |
| 3,413,205 | 11/1968 | Hardman | 204/129.85 |
| 3,421,987 | 1/1969 | La Boda | 204/129.95 |
| 3,791,948 | 2/1974 | Dixon et al. | 204/129.75 |
| 3,959,098 | 5/1976 | Schwartz | 204/129.3 |

Primary Examiner—T. M. Tufariello
Attorney, Agent, or Firm—John T. O'Halloran; Peter C. Van Der Sluys

[57] ABSTRACT

KOH can be used as the electrolyte for self-limiting etching of GaAs to preferentially remove p-type material from n-type material but does not work with GaAlAs because etching is halted by the precipitation of aluminium hydroxide. An aqueous solution of triethanolamine has been found to be an alternative electrolyte which does not suffer from this problem. Preferably no external drive voltage is used but instead the current flow is promoted by the e.m.f. developed by the etching cell itself.

7 Claims, 1 Drawing Figure

U.S. Patent
Mar. 6, 1979
4,142,953
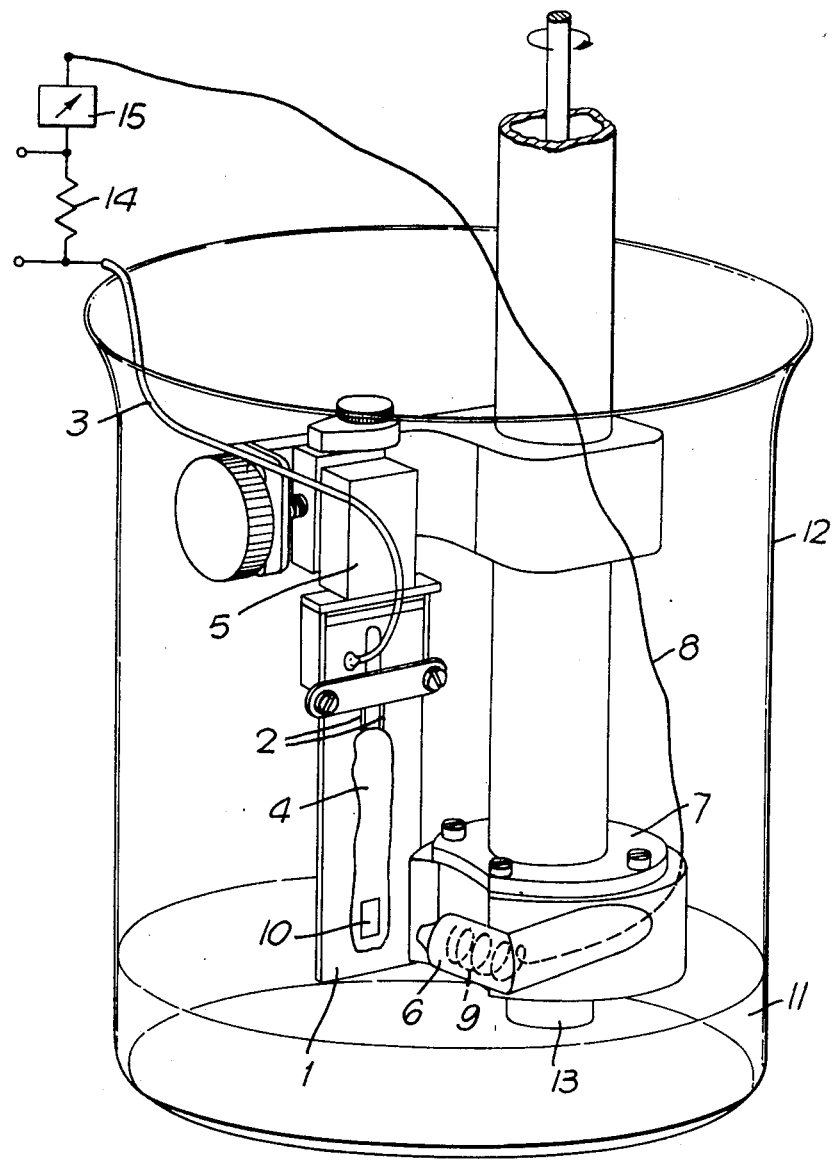

SEMICONDUCTOR ETCHING

This invention relates to the etching of semiconductive material and in particular to the electrochemical self-limiting etching of gallium arsenide, and its semiconductive solid solutions with other elements in Groups III and V of the Periodic Table, particularly aluminum, in which p-type material is etched preferentially with respect to the etching of n-type material.

A suitable electrolyte for electrochemical self-limiting etching of gallium arsenide is provided by an aqueous solution of potassium hydroxide. However if the same electrolyte is used for etching gallium aluminium arsenide containing a significant amount of aluminium, such as used in the manufacture of heterostructure lasers, it is found that the aluminium inhibits the dispersal of the products of etching which instead build up into a coherent layer which then beings the etching to a halt.

The present invention discloses the use of an alternative electrolyte in which aluminium will not behave in this way, and thus the electrolyte can be used not only for etching gallium arsenide but also its semiconductive solid solutions with other III-V elements such as in particular gallium aluminium arsenide.

According to the present invention there is provided a method of electrochemical self-limiting etching of a workpiece of semiconductive material consisting of gallium arsenide and/or one or more of its solid solutions with other elements selected from Groups III and V of the Periodic Table, which workpiece contains an exposed region of p-type material backed by n-type material, wherein the workpiece is made one electrode of an electrochemical cell whose other electrode is made of platinum and whose electrolyte is provided by an aqueous solution of triethanolamine, and wherein during the etching the workpiece its surface is protected from exposure to radiation of short enough wavelength to give rise to the generation thereat of photon-excited electron-hole pairs.

Although an external voltage source may be used to drive a current through an electrochemical etching cell, it is preferred with this etching method to rely instead upon the voltage developed by the cell itself. The current flow produced by this cell voltage may be reduced by the use of an external voltage source to back-off part of the cell voltage. A reduced voltage is found to give improved selectivity in the preferential etching of p-type material with respect to the etching of n-type material. Since this selectivity depends upon the absence of holes at the n-type surface it is necessary to perform the etching in the absence of any radiation of short enough wavelength to give rise to the generation of photon-excited electron-hole pairs at the semiconductor surface. In respect to its ability satisfactorily to etch gallium aluminium arsenide, tri-ethanolamine is believed to promote the dispersal of the products of etching by acting as a complexing agent for trivalent metals thereby preventing the precipitation of aluminium hydroxide.

There follows a description of an electrochemical etching cell and of its use in performing the etching method of the present invention. The description refers to the drawing accompanying the Provisional Specification which depicts the cell. A workpiece 10 of $Ga_{1-x}Al_xAs$ (x=0.35) containing one or more exposed regions of p-type material which it is desired preferentially to etch is mounted on a substrate 1, which may be a glass microscope slide, provided with pair of conductive tracks 2 to both of which electrical connection is made by way of a lead 3. This forms one electrode of the cell. The tracks 2 extend to beneath the workpiece 10 and are electrically connected with its edges. These connections and the lower part of the tracks are masked for instance with black wax 4. An adjustable mount 5 is used to locate the workpiece about half a centimeter in front of the output jet 6 of a centrifugal pump 7 made of p.t.f.e. The other electrode of the cell is provided by a platinum wire 8 terminating in a coil 9 inside the jet so that bubbles of hydrogen evolved at its surface are continuously dislodged by the circulation of electrolyte through the pump thereby tending to prevent the build-up of an excessive hydrogen over-voltage. The electrolyte 11 is an equeous solution of tri-ethanolamine to which has been added an electrical conductivity enhancing material, such as potassium chloride. A typical solution contains 3 to 5% tri-ethanolamine and 2% potassium chloride. The electrolyte is contained in a beaker 12, and the pump 7 is lowered until its inlet port 13 is beneath the level of electrolyte while the jet 6 and the workpiece remain above this level. The open-circuit voltage of the cell is typically about 400 mv. External connection between the two electrodes the cell is made by way of a resistor 14, enabling the cell current to be measured, and optionally by way of an adjustable backing off voltage source 15 in series with the resistor 14.

In view of the small voltages involved in this etching process it is necessary to have a good ohmic contact on the workpiece for connection to the tracks 2 on the microscope slide. The positioning of the contact is important in relation to the operation of the tracks 2 on the microscope slide. The positioning of the contact is important in relation to the operation of the etching process in that it is desirable to avoid a geometry that could lead to the etching process exposing the underlying n-type material in such a way as to leave islands of p-type material electrically isolated from the contact. If an island of this sort is created it will cease to be etched. In the case of a workpiece of $Ga_{1-x}Al_xAs$ it is preferred to deposit by vacuum evaporation gold-zinc alloy, suitable for making an alloyed contact, in selected areas at the edges of the workpiece. This slice is heated to form alloyed contacts, and then it is preferred to use electrically conductive paste (not shown) to perform the dual function of securing the workpiece to the microscope slide and of making electrical connection between the alloyed contacts and the electrically conductive tracks on the microscope slide. The contacts, the paste, and the conductive tracks on the microscope slice, are then masked from the electrolyte with the wax. When the etching has been completed the two alloyed contacts can be removed from the workpiece by cleaving.

Etching is found to proceed satisfactorily with a current density at the portion slice surface being etched in the region of 0.5mA $cm^{-2}$, and is found to be highly selective provided that the cell is kept in darkness. In day light selectivity is virtually destroyed, persumably because the n-type material can be attacked in the presence of minority carries derived from photo-excitation. Daylight is conveniently excluded from the cell by placing the beaker 12 in a lidded tank of opaque material (not shown).

I claim:

1. A method of electrochemical self-limiting etching of a workpiece of semiconductive material consisting of gallium arsenide and/or one or more of its solid solutions with other elements selected from Groups III and V of the Periodic Table, which workpiece contains an exposed region of p-type material backed by n-type material, wherein the workpiece is made one electrode of an electrochemical cell whose other electrode is made of platinum and whose electrolyte is provided by an aqueous solution of tri-ethanolamine, and wherein during the etching the workpiece its surface is protected from exposure to radiation of short enough wavelength to give rise to the generation thereat of photon-excited electron-hole pairs.

2. A method as claimed in claim 1 wherein the workpiece is made of gallium aluminium arsenide.

3. A method as claimed in claim 1 and 2 wherein the electrolyte is directed against the workpiece in a jet by a pump.

4. A method as claimed in claim 3 wherein the platinum electrode is located in the jet of electrolyte.

5. A method as claimed in claim 1 wherein the electrolyte includes a dissolved salt enhancing its electrical conductivity.

6. A method as claimed in claim 1 wherein the drive voltage for the electrochemical etching is provided by the voltage developed by the electrochemical cell itself.

7. A method as claimed in claim 6 wherein an external voltage source is used to back-off part of the voltage developed by the electrochemical cell.

* * * * *